United States Patent [19]
Cappelli et al.

[11] Patent Number: 5,358,596
[45] Date of Patent: Oct. 25, 1994

[54] METHOD AND APPARATUS FOR GROWING DIAMOND FILMS

[75] Inventors: Mark A. Cappelli, Mountain View; Michael H. Loh, Menlo Park, both of Calif.

[73] Assignee: The Board of Trustees of the Leland Stanford Junior University, Stanford, Calif.

[21] Appl. No.: 907,802

[22] Filed: Jul. 2, 1992

[51] Int. Cl.[5] ............................................. C30B 29/04
[52] U.S. Cl. ................................. 117/99; 423/446; 117/103; 117/929
[58] Field of Search ............ 156/610, 611, 613, 620.72, 156/DIG. 68, DIG. 89; 423/446

[56] References Cited

U.S. PATENT DOCUMENTS

| | | | |
|---|---|---|---|
| 4,961,958 | 10/1990 | Desphandey et al. | 423/446 |
| 5,104,634 | 4/1992 | Calcote | 156/DIG. 68 |
| 5,110,405 | 5/1992 | Sawabe et al. | 156/610 |
| 5,204,145 | 4/1993 | Gasworth | 156/DIG. 68 |

*Primary Examiner*—R. Bruce Breneman
*Assistant Examiner*—Felisa Garrett
*Attorney, Agent, or Firm*—Flehr, Hohbach, Test, Albritton & Herbert

[57] ABSTRACT

A supersonic, direct-current arcjet is designed for expansion into low pressure, the arcjet operates as mixtures of hydrogen and argon to convert molecular hydrogen to atomic hydrogen and direct the atomic hydrogen to a substrate surface. A hydrocarbon (methane or acetylene) is introduced in the arcjet plume where it is converted to hydrocarbon precursors and is directed to the substrate surface where it combines with the atomic hydrogen to produce a diamond film.

9 Claims, 8 Drawing Sheets

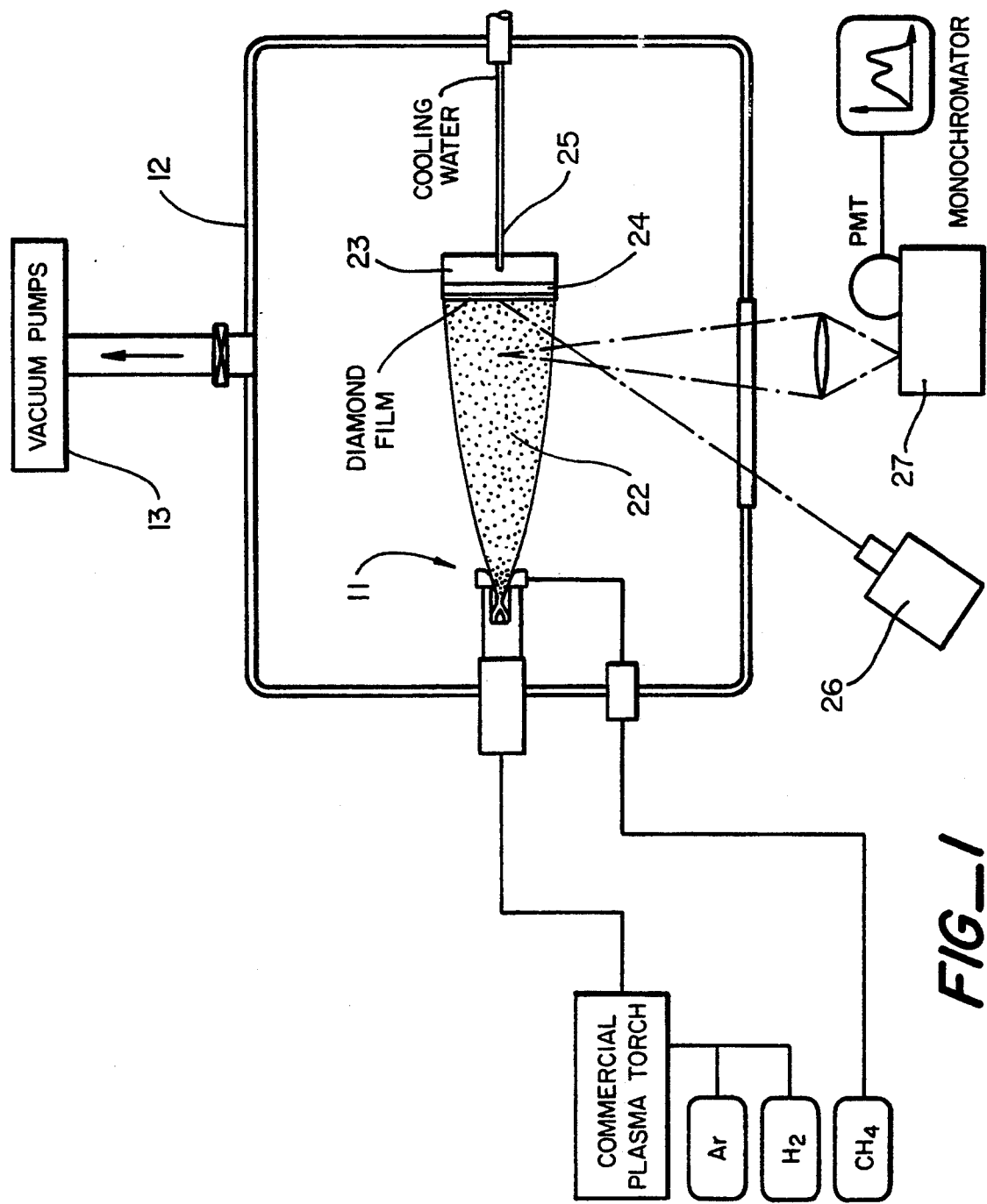
FIG_1

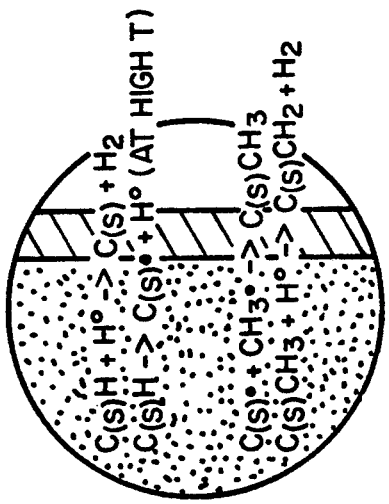
FIG_2D
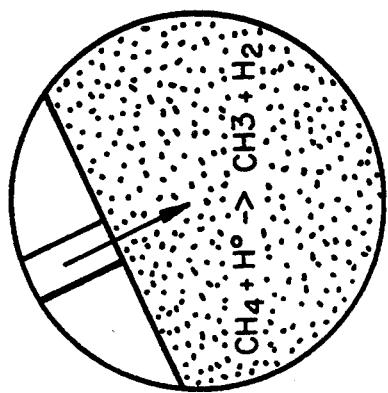
FIG_2C
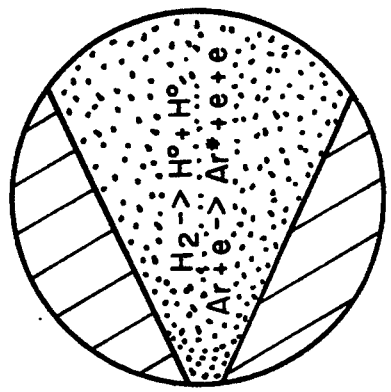
FIG_2B
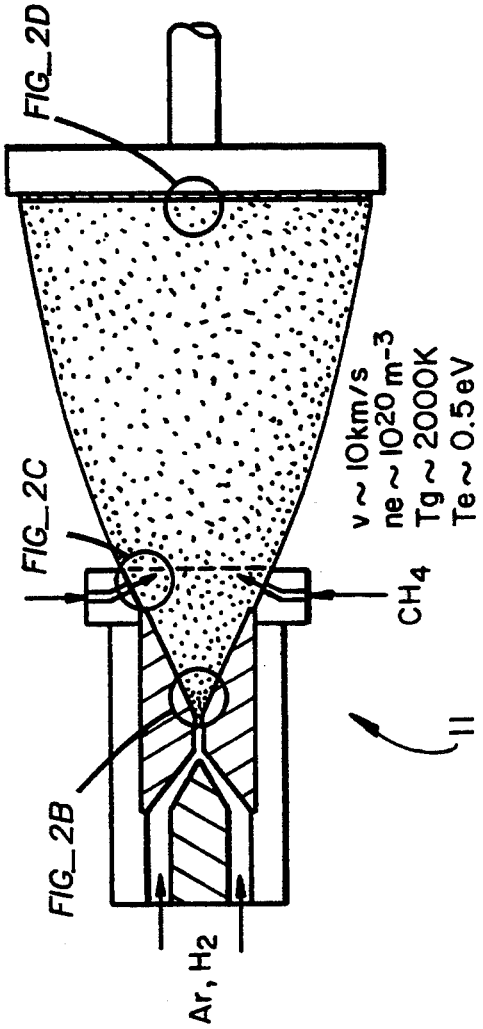
FIG_2A

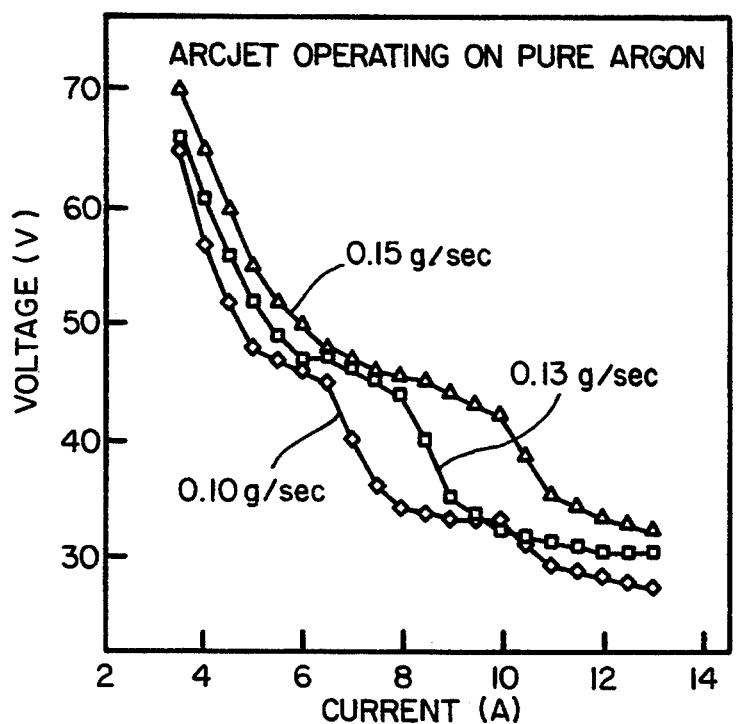
FIG_3
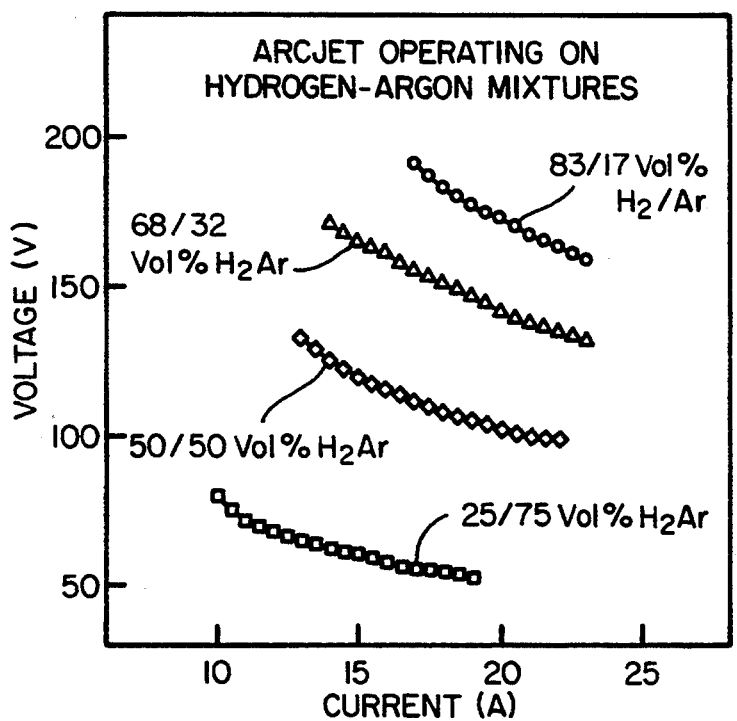
FIG_4

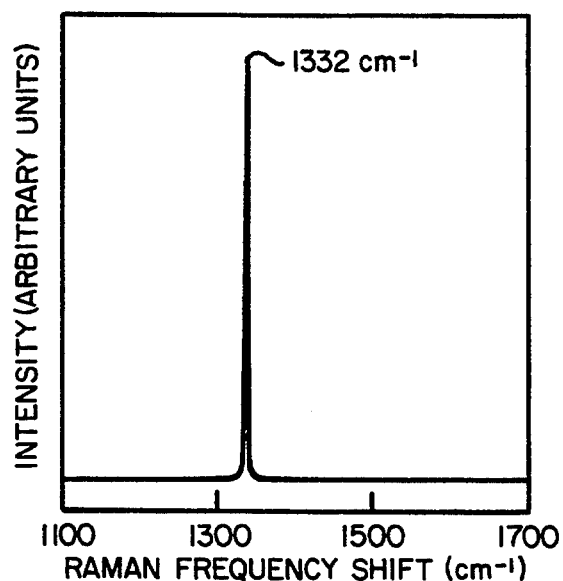
FIG_5
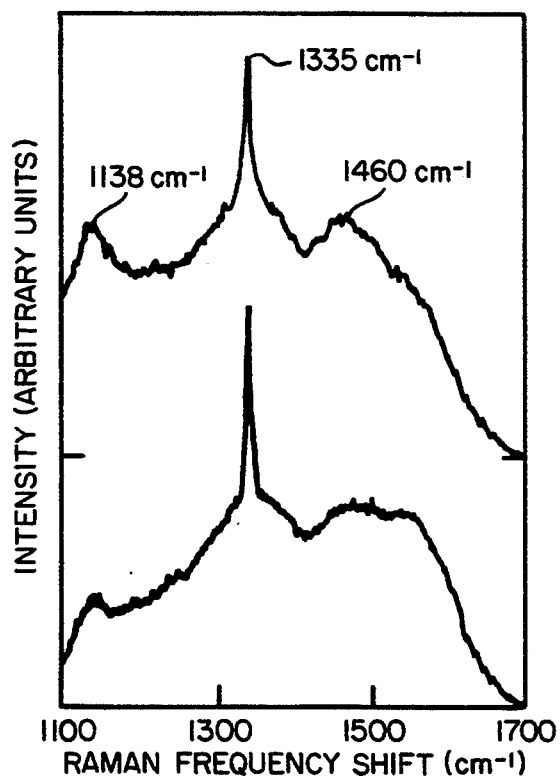
FIG_6
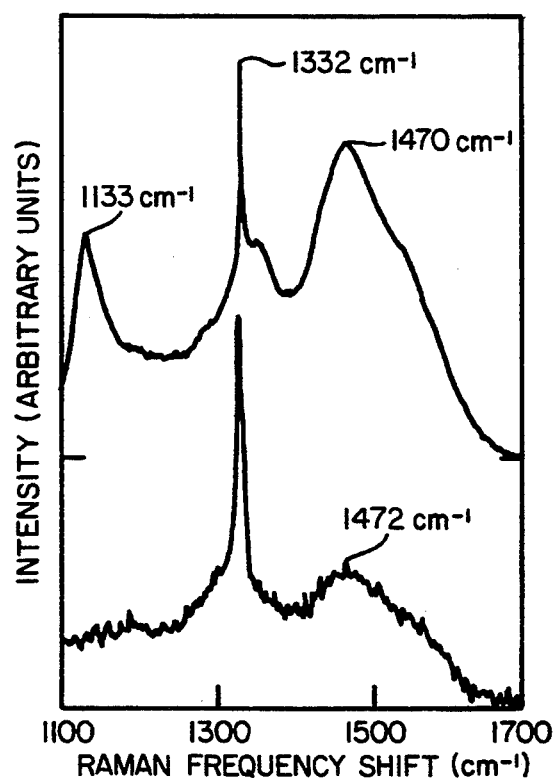
FIG_9

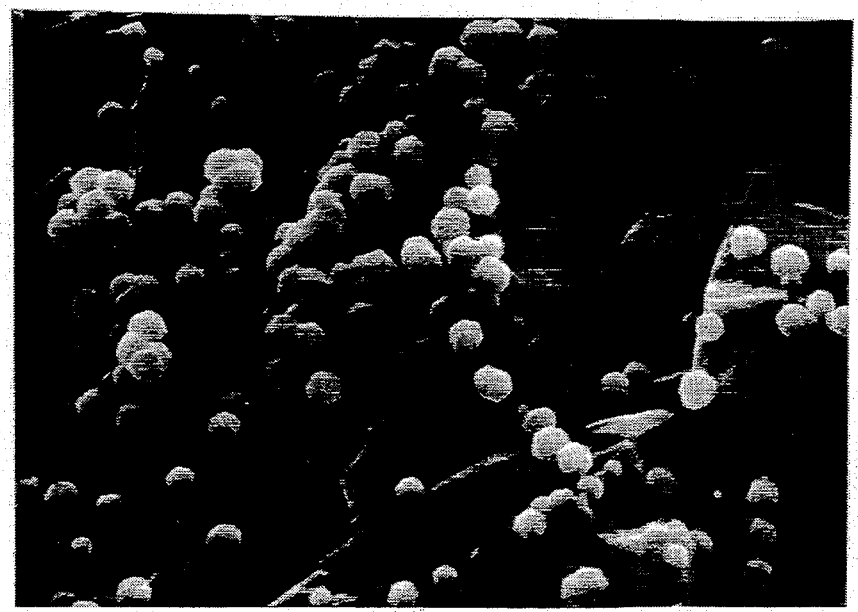
FIG_7A
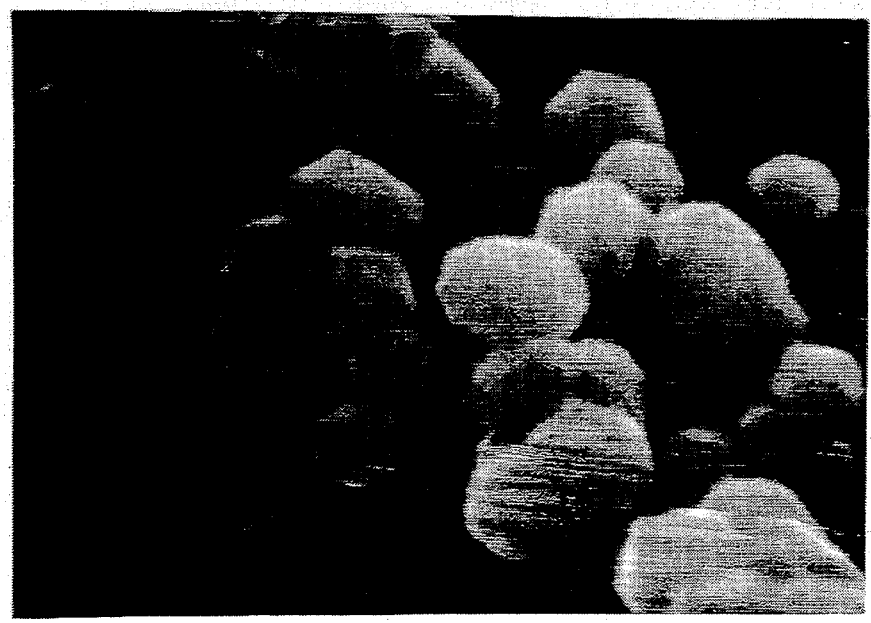
FIG_7B

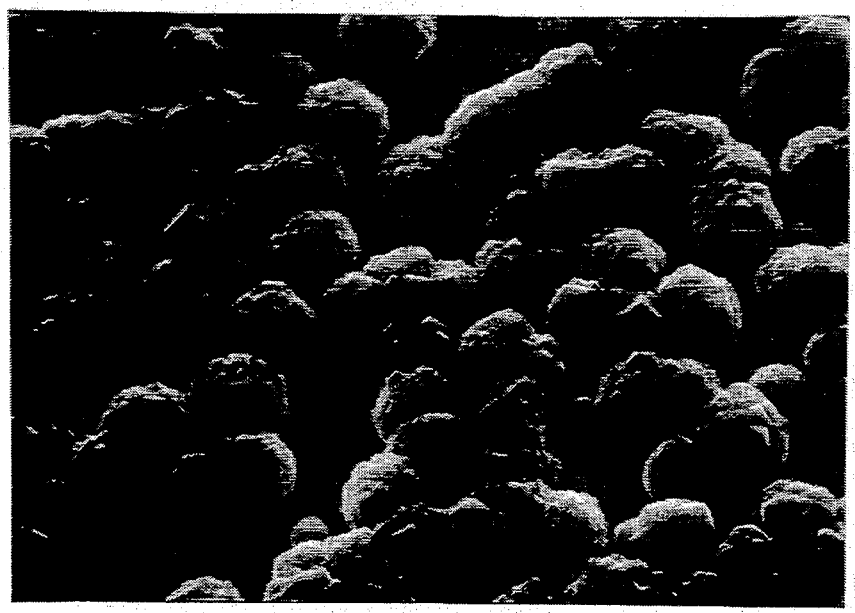
FIG_8A
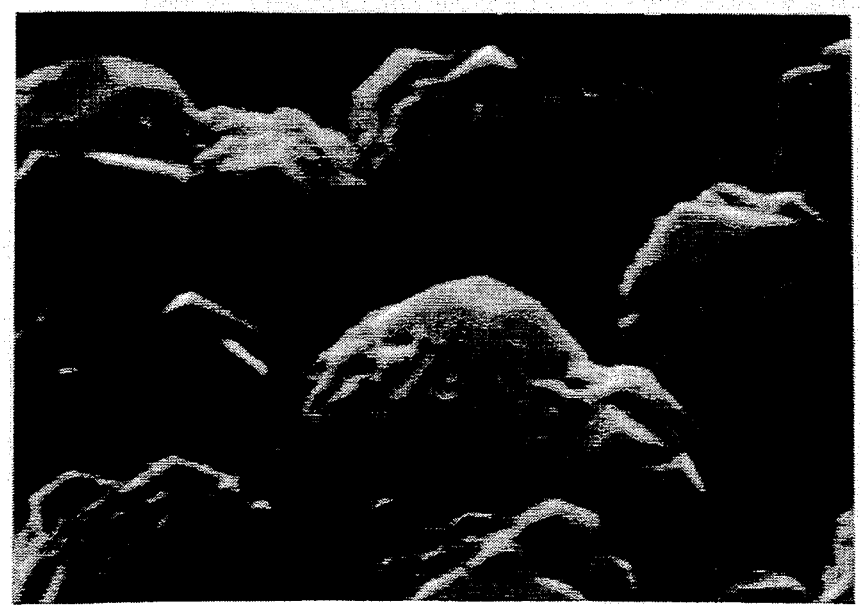
FIG_8B

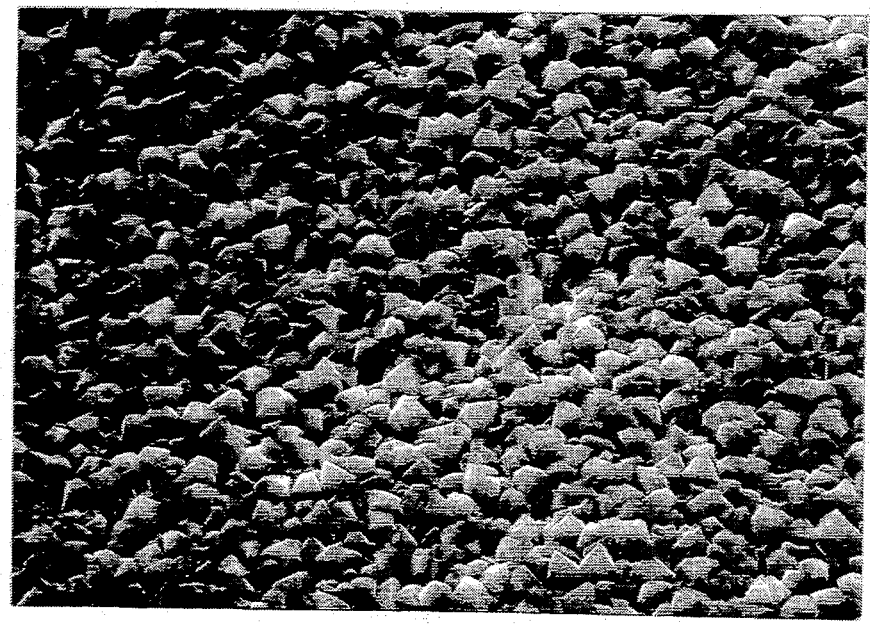
FIG_10A
FIG_10B

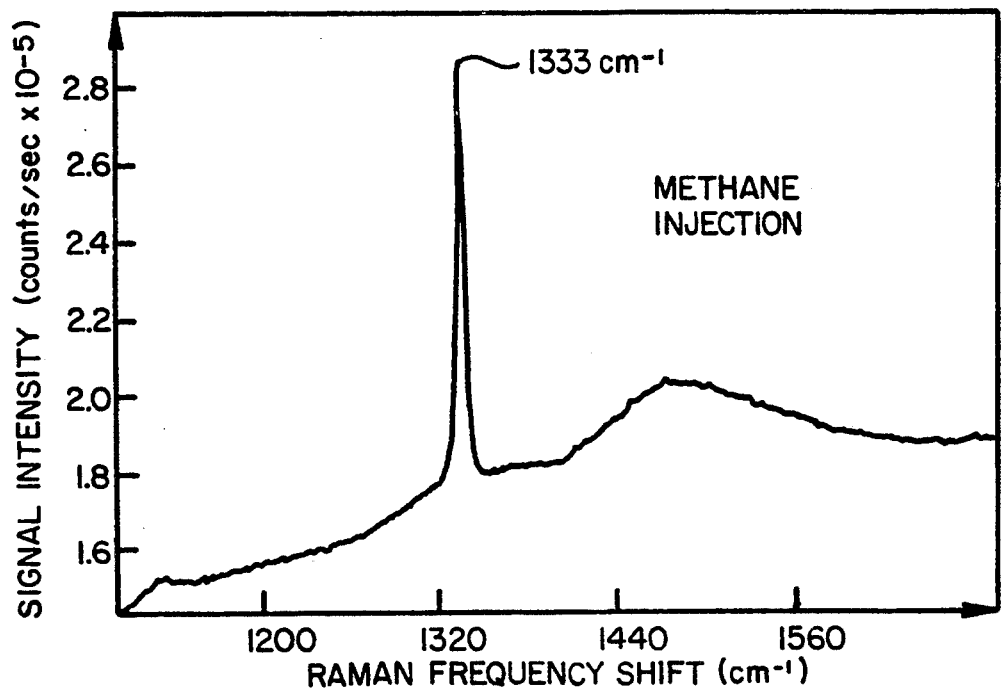
FIG_ 11A
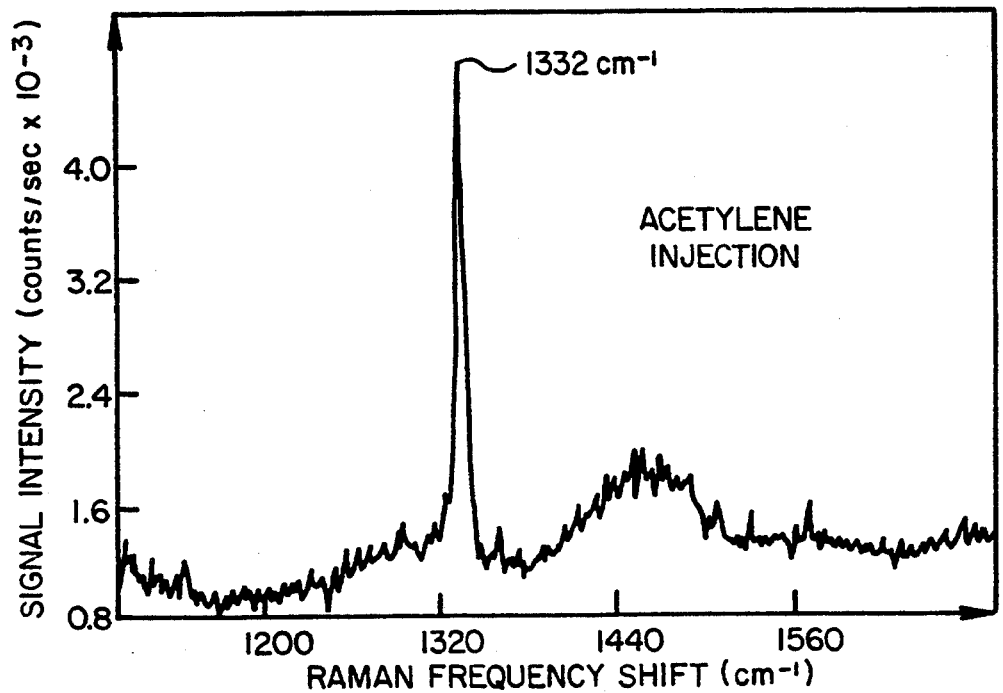
FIG_ 11B

METHOD AND APPARATUS FOR GROWING DIAMOND FILMS

BRIEF DESCRIPTION OF THE INVENTION

This invention relates generally to a method and apparatus for growing diamond films, and more particularly, to a method and apparatus for growing diamond films by converting a supersonic arcjet flow molecular hydrogen to atomic hydrogen which then reacts on a substrate with hydrocarbon precursors to form diamond films.

BACKGROUND OF THE INVENTION

Diamond research activities have increased dramatically in recent years, an outcome fueled primarily by diamonds' superior mechanical, thermal, and optical properties. It is known to have the highest thermal conductivity while being an excellent electrical insulator. Furthermore, it is an extremely hard material, has excellent corrosion resistance, and transmits optically over a broad wavelength range.[1,2] These properties lead to many potential applications for diamond coatings as well as free standing films.[3] Research in the chemical vapor deposition (CVD) of diamond has led to the development and use of many different synthesis techniques, ranging from hot filament and microwave activation[1,2] (generally at low pressures) to arc[4,5] and flame[6,7] excitation (generally near atmospheric pressure). High quality diamond in thin film form to free standing samples of several millimeter thickness are now commercially available.

Despite the progress that has been observed in the manufacture of engineered diamond, little is known about the chemistry controlling nucleation and growth. Identification of the growth precursors and mechanisms for carbon incorporation into the growing diamond surface is now the subject of intense experimental and theoretical research. Detailed mechanisms based on both methyl [8,9] ($CH_3$) and actylene [10] ($C_2H_2$) as precursors have been proposed recently. As most synthesis strategies rely on the production of copious amounts of atomic hydrogen, it is now generally believed that atomic hydrogen plays an important role in growth kinetics by preventing surface reconstruction of the growing diamond film (i.e. stabilizing $sp^3$ hybridized surface carbon bonds), and by producing active sites through abstraction of surface hydrogen.[2,11] These active sites are now available to react with possible growth precursors.

DC arcjets have proven to be of great potential in diamond synthesis,[12-18] for they deliver the highest linear growth rates at nearly 1 mm per hour while still retaining excellent quality.[12]

OBJECTS AND SUMMARY OF THE INVENTION

It is an objective of this invention to provide a method of converting elemental carbon from a vapor or liquid source (hydrocarbon or alcohol) to diamond.

It is another objective of this invention to convert in a supersonic arcjet molecular hydrogen at relatively high pressure to atomic hydrogen at relatively low pressure for reaction with elemental carbon on a substrate to grow diamond films.

It is yet another objective of this invention to provide an apparatus for growing diamond films which convert molecular hydrogen to atomic hydrogen and directs the molecular hydrogen onto the surface of a substrate where it can combine with elemental carbon to form a diamond film.

These and other objects of the invention are achieved by an apparatus and method in which molecular hydrogen is converted to atomic hydrogen which is transported to a deposition surface and supplying elemental carbon to the deposition surface where it reacts with atomic hydrogen to produce a diamond film.

BRIEF DESCRIPTION OF THE DRAWINGS

The foregoing and other objects of this invention will be more clearly understood from the following detailed description when read in conjunction with the appended drawings, in which:

FIG. 1 is a schematic diagram of an apparatus for carrying out the invention;

FIG. 2A is an enlarged view of the nozzle which forms the arcjet and the reactions which occur at various regions of the arcjet, arcjet plume and substrate;

FIG. 2B is an enlarged view of the portion of FIG. 2A labeled FIG. 2B; FIG. 2C is an enlarged view of the portion of FIG. 2A labeled FIG. 2C; and FIG. 2D is an enlarged view of the portion of FIG. 2A labeled FIG. 2D.

FIG. 3 shows the voltage current characteristics of the arcjet for operation with pure argon;

FIG. 4 shows the voltage current characteristics for operating the arcjet on hydrogen/argon mixtures;

FIG. 5 shows a Raman spectrum of natural diamond;

FIG. 6 shows the Raman spectrum of diamond films grown on a silicon substrate;

FIGS. 7A and 7B show a scanning electron micrograph at different magnifications of a diamond film deposited on a silicon substrate during a 30-minute run (850° C. substrate temperature, 4.5% $CH_4/H_2$);

FIGS. 8A and 8B show a scanning electron micrograph (different magnification) of a diamond film deposited on a molybdenum substrate during a 15-minute run (850° C. substrate temperature, 4.5% $CH_4/H_2$);

FIG. 9 shows the Raman spectra of diamond films grown on molybdenum;

FIG. 10A shows a scanning electron micrograph of a diamond film deposited on molybdenum during a one-hour run (850° C., 0.85% $CH_4/H_2$) with pure hydrogen as the carrier gas, FIG. 10B is a scanning electron micrograph of a diamond film grown on molybdenum during a one-hour run (850° C., 0.85% $C_2H_2/H_2$) with pure hyrogen as the carrier gas;

FIG. 11A shows the Raman spectra of the diamond films described in FIG. 10A; and FIG. 11B shows the Raman spectra of the diamond film described in FIG. 10B.

DETAILED DESCRIPTION OF DRAWINGS

Referring to FIG. 1, the arcjet assembly 11 installed in a large stainless steel vacuum chamber 12 connected to mechanical pumps/blowers 13 to maintain background pressures in the chamber 12 well below 1 torr (typically 200 mtorr) at volumetric flow rates of approximately 5l/min. The DC-arcjet comprises a cathode 14 having a conical end 16 which is spaced from the conical recess 17 formed in the anode 18. The cathode and anode are spaced to create an arc when suitable voltages are applied therebetween. The arcjet is operated in the so-called high voltage mode which precludes the need for high current densities to achieve the necessary Joule heating and plasma generation. A low current density gives rise to diffuse as opposed to constricted arc attachment to the anode, minimizing anode erosion. Argon and hydrogen are introduced into the arcjet at three times atmospheric pressure where they pass into the arc to form a jet stream which flows through the restricted zone 19 of the anode, then to the expansion region 21 of the anode where the reaction products expand to form a supersonic plasma plume 22.

Typical operating conditions during diamond synthesis are given in Table 1. The mixture of hydrogen and argon at the ratio shown in Table 1, or hydrogen alone, is passed directly through the arcjet where dissociation of molecular hydrogen as well as ionization of argon and hydrogen takes place at arc temperatures on the order of 20,000K. Due to the high temperatures, a large amount of atomic hydrogen is produced. Rapid expansion into pressures as low as 200 mtorr freezes the flow towards the substrate since reduced collision activity minimizes the volume recombination of atomic hydrogen, which is believed to be an important precursor for the formation of diamond films.

Methane (or other hydrocarbons, such as acetylene) is added downstream of the arc near the end of the expansion nozzle 19 of the anode at inlets 21 at rates such that it comprises 1–25% of the combined volumetric flow of methane and hydrogen. The post nozzle injection provides control of the methyl flux incident on the substrate.

Silicon [(100) crystal orientation] and polycrystalline molybdenum discs mounted on a water cooled copper mandrel 23 served as substrate 24. Prior to growth, the substrates were scratched with 1-2 $\mu$m grain size diamond paste. The distance between the substrate and the arcjet exit plane was varied between 70 to 140 mm. The temperature at the backface of the substrate was measured with an R-type thermocouple probe 25, while the brightness temperature of the diamond growth surface was monitored by means of a disappearing filament optical pyrometer 26. The substrate temperature was varied between 800° C. and 1200° C. A qualitative assessment of the plasma plume conditions was achieved by optical emission spectroscopy 27.

FIG. 2 schematically illustrates the gas activation in the arcjet and the jet expansion region, the reaction of methane with the atomic hydrogen, the impingement of the plume on the substrate and the formation of diamond crystals at the active sites of the substrate.

The system can operate over a wide range of conditions to obtain the best performance and the most stable operating conditions for diamond growth. Runs were performed with pure argon at different mass flow rates, with hydrogen-argon mixtures at different mixture compositions, which also resulted in different mass flow rates, or with pure hydrogen. The arcjet was started by setting the current to an initial value known for stable operation. After ignition, the voltage adjusted itself to match the plasma impedance. The arcjet was run about 15 minutes as a warm-up. The data collection was initiated by setting the current to the lowest possible value that was capable of sustaining a stable discharge. The current/voltage data was recorded after the arcjet reached steady state conditions. The ranges close to the lower current limit of operation showed unstable operation and fluctuations. The upper current limits were not fully pursued due to the danger of overheating the cathode at high currents resulting in increased cathode erosion. The results for pure argon at mass flow rates from 0.1 to 0.15 g/sec are shown in FIG. 3. In general, argon does not exhibit very stable behavior, and shock structures were clearly visible in the plasma plume. All curves with argon as a feed gas have the same characteristic shape, starting at a high voltage with low current, descending steeply through a region of unstable behavior, where the arc attachment is believed to make a transition from a point in the nozzle to a region in the constrictor. When the slope starts to decrease, the arcjet operating conditions stabilize, but only until a transition occurs as evident from the sudden voltage drop for increasing currents. It is apparent that the point of transition moves to higher currents for greater mass flow rates. At the upper current limit, higher current densities are believed to yield a more constricted anode arc attachment (as opposed to diffuse attachment), thus increasing anode erosion.

Adding hydrogen to the argon immediately changes the plasma behavior, even for very low percentages of the total feed gas mass flow rate. Bow and diamond shock features disappear completely and we observe a widely expanding, very uniform plasma plume. The recorded current-voltage characteristics for four different hydrogen-argon mixtures are shown in FIG. 4. The power level increases with increasing hydrogen percentage and the arc is very stable along the entire current-voltage curves. We do not see a steep voltage drop nor the transition regions with hydrogen-argon mixtures. Comparing the slopes of the curves with the slopes of the stable regions of the pure argon curves shows that the arcjet operates in the stable region. This suggests that the arc attachment is diffuse and downstream of the throat in the low pressure region of the nozzle. The upper limit was not approached for the reasons mentioned. In general, operation on hydrogen-argon mixtures showed very smooth plasma behavior, well suited for diamond synthesis.

The system was then operated by injecting or introducing methane into the supersonic plasma plume, as shown in FIGS. 1 and 2. Optical emission scans of the diamond growing plasma between 200 and 700 nm wavelength showed very intense lines of the Balmer series of atomic hydrogen and the CH $A^{2\Delta}$ ($v$−0) −$X^2\Pi$ ($v$=0) band at around 430 nm. There was little or no detectable emission from other hydrocarbon or carbon species. The intensity ratio of CH and H emission features qualitatively reflected the progression of methyl formation along the plasma plume. The relatively weak CH band the missing C features, such as the usually strong Swan-band ($C_2$), suggested that the dissociation of methane did not proceed far enough to produce these carbon species. This is consistent with the relatively large estimated mean free path (>1 rmn) within the plasma, and the characteristic path length for a hydrogen abstraction event for methyl production from methane (about 10 cm). Thus, the predominant carbon containing species at the diamond growth surface of this system is believed to be methyl. By injecting methane into the plasma plume 10 cm away from the substrate, it is possible to optimize the methyl flux incident onto the substrate surface. We note, however, that other hydrocarbons injected into the plasma stream (i.e., acetylene) also lead to diamond growth.

Diamond films were deposited on molybdenum and silicon substrates, and analyzed by micro-Raman spectroscopy and scanning electron microscopy (SEM). A Raman spectrum is a characteristic signature that identifies, for instance, diamond, diamond-like carbon, and graphitic carbon.[26] Diamond has a sharp and intense Raman peak at 1332 cm$^{-1}$. The width of the line is related to the structural order of the crystal lattice and hence, to the quality of the diamond. In CVD diamond, the peak may be shifted due to stresses in the diamond film. As a reference, a Raman spectrum of natural diamond is shown in FIG. 5. Non-diamond contributions generally span the region between 1100 cm$^{-1}$ and 1700 cm$^{-1}$. For example, graphitic carbon has intense bands near 1340 cm$^{-1}$ and 1580 cm$^{-1}$.

The diamond films grew over the entire substrate area, as large as 12 cm$^2$, however, not yet exploiting the entire plasma plume expansion. Run times were between 10 minutes and one hour. In all runs, microscopic analysis of the films revealed very regular nucleation over the entire substrate area. Film thicknesses were found to be slightly greater in the center of the sample than near the edge. Micro-Raman analysis indicated that the film quality was better near the outer radial regions. This assessment is based on the relative intensity of the 1332 cm$^{-1}$ peak to the non-diamond features in the Raman spectra. The reason for this radial variation in film quality is yet unclear, and is believed to be related to radial temperature gradients.

Raman spectra of diamond films grown on silicon at methane to hydrogen volumetric flow rates of 15% and 12% and substrate temperatures of 1000° C. and 850° C. are shown in FIG. 6. These CH$_4$/H$_2$ flow ratios, in particular, that employed for film growth in FIG. 6 (top), is unusually high in comparison to flow ratios generally employed in hot filament and microwave-driven plasma synthesis of diamond[2], however, we do see improvement in film quality when we operate at lower methane to hydrogen flow ratios (FIG. 6, bottom), which is a trend that is consistent with that observed in most other activating methods.

SEM micrographs of diamond films deposited under similar conditions as the films analyzed by Raman spectroscopy are shown for growth on a silicon substrate (FIGS. 7A and 7B) and on a molybdenum substrate (FIGS. 8A and 8B).

Films grown on molybdenum substrates have Raman spectra that are qualitatively similar to that of films grown on silicon. A Raman spectrum of a film grown on molybdenum at a temperature of ~850° C. and a methane to hydrogen ratio of ~5.4% is shown in FIG. 9. We note that for increasing methane to hydrogen ratios and decreasing temperature, we see increasingly persistent and sharp features at approximately 1140 cm$^{-1}$ and 1470 cm$^{-1}$. These features have also been observed and discussed previously.[27] The feature at 1140 cm$^{-1}$ has been attributed to disordered or microcrystalline diamond,[27] however, the consistent appearance of the 1140 cm$^{-1}$ peak with that at 1470 cm$^{-1}$ makes this assignment tenuous. These features overwhelm the Raman spectrum of films grown on molybdenum at lower temperatures and methane to hydrogen flow ratios (FIG. 9) but essentially disappear in films synthesized at 850° C. and 2.6% methane in hydrogen (FIG. 9).

FIG. 10A shows a scanning electron micrograph of a diamond film deposited during a one-hour run (850° C. substrate temperature, 0.85% CH$_4$/H$_2$) with pure hydrogen as the carrier gas and FIG. 10B shows a micrograph of a film grown under similar conditions using C$_2$H$_2$/H$_2$. FIGS. 11A and 11B show the Raman spectra of the diamond films shown in FIGS. 10A and 10B, respectively.

In general, we observe growth rates in the range of 1–20 $\mu$m/hr, with only a weak dependence of growth rate on methane to hydrogen flow ratios. The growth rates appear to correlate more closely to the total mass flow rate through the arcjet, although an extensive analysis of what determines both maximum growth rate and optimal film quality has yet to be performed.

Operating at low pressures, supersonic DC arcjets have a number of advantages which are very promising with respect to understanding the surface chemistry of diamond growth. These advantages include a well-defined gas phase environment that provides the means to optimize the type of species incident on the diamond growth surface. Further, the subtorr pressures present an environment where the reactive species flux arriving at the growth surface can be more confidently reached by molecular beam mass spectrometry. The high flux provides significant growth rates despite the low pressures investigated here. The observed growth rates are still comparable to and in some cases much greater than that observed in hot filament and microwave plasma synthesis of diamond films.[2] Furthermore, the diamond synthesis can be scaled to exceptionally large areas due to the wide expansion of the plasma plume.

Preliminary parametric investigations of diamond growth indicate that higher methane to hydrogen flow ratios support growth at higher substrate temperatures. These results are consistent with observations in other high growth rate environments such as flame and RF plasma torch synthesis of diamond.[28,29] The films, however, still display Raman features that indicate significant non-diamond content. The addition of oxygen, as molecular oxygen or in the form of an alcohol, to the flow is likely to improve the film quality by kinetically hindering the growth of these undesirable phases.

J. C. Angus and C. C. Hayman, Low-Pressure, Metastable Growth of Diamond and "Diamond-like" Phases, Science 241, 913, August 1988

W. A. Yarbrough and R. Messier, Current Issues and Problems in the Chemical Vapor Deposition of Diamond, Science 247, 688, February 1990

*Molecule of the Year, Diamond: Glittering Prize for Materials Science*, Science 250, Dec. 1990

K. Kurihara, K. Sasaki, M. Kawarada and N. Koshino, *High Rate Synthesis of Diamond by DC Plasma Jet Chemical Vapor Deposition*, Appl. Phys. Lett. 52(6), 437, February 1988

F. Akatsuka, Y. Hirose and K. Komaki, *Rapid Growth of Diamond Films by Arc Discharge Plasma CVD*, Japan J.Appl. Phys. 27 (9), L1600, September 1988

L. M. Hanssen, W. A. Carrington, J. E. Butler and K. A. Snail, *Diamond Synthesis using an Oxygen-Acetylene Torch*, Matt. Lett. 7 (7-8), 289, December 1988

M. A. Cappelli and P. H. Paul, *An Investigation of Diamond Film Deposition in a Premixed Oxyacetylene Flame*, J.Appl. Phys. 67 (5), 2596, March 1990

S. J. Harris, *Mechanism for Diamond Growth from Methyl Radicals*, Appl. Phys. Lett. 56 (23), 2298, June 1990

S. J. Harris and L. R. Martin, *Methyl versus Acetylene as Diamond growth Species*, J.Mater. Res. 5(11), 2313, November 1990

M. Frenklach and K. E. Spear, J.Mat. Res. 3, 133, 1988

M. Frenklach, *The Role of Hydrogen in Vapor Deposition of Diamond*, J.Appl. Phys. 65(12), 5142, June 1989

N. Ohtake and M. Yoshikawa, *Diamond Film Preparation by Arc Discharge Plasma Jet Chemical Vapor De-*

*position in the Methane Atmosphere,* Journal of the Electrochemical Society 137 (2), February 1990

R. Furukawa, H. Uyama and O. Matsumoto, *Diamond Deposition with Plasma Jet at reduced Pressure,* IEEE Transactions on Plasma Science, 18(6), December 1990

K. R. Stalder and R. L. Sharpless, *Plasma Properties of a Hydrocarbon Arcjet used in the Plasma Deposition of Diamond Thin Films,* J.Appl. Phys. 68 (12), 6187, December 1990

P. Klocek, J. Hoggins, P. Taborek and T. McKenna, CVD *Diamond Growth by DC Plasma Torch,* SPIE Voi. 1325, Diamond Optics III (1990)

Z. P. Lu, L. Stachowics, J. Heberlein and E. Pfender, *Effects of Process Parameters on Chemical Vapor Deposition in Fiamond in Thermal Plasmas,* 107 Proc. The Electrochem. Soc. 1990

S. Matsumoto, I. Hosoya and T. Chounan, *Substrate Bias Effect on Diamond Deposition by DC Plasma Jet,* Japan.J.Appl. Phys. 29 (10), 2082, October 1990

R. L. Woodin, L. K. Bigelow and G. L. Cann, *Synthesis of Large Area Diamond Films by a Low Pressure DC Plasma Jet,* Proc. Applications of Diamond Films and Related Materials, Y. Tzeng, M. Yoshikawa, M. Murakawa, A. Feldman (Eds.), Elsevier Science Publishers B.V. 1991

T. G. Owano, D. G. Goodwin, C. H. Kruger, M. A. Cappelli, *High Growth Rate Diamond Synthesis in a Large Area Atmospheric Pressure Inductively Coupled Plasma,* Proc.of the Second Int'l Conf. on he New Diamond Science and Technology, Washington D.C., Sep. 23–27, 1990, p. 497

W. L. Hsu, *Mole Fractions of H, $CH_3$, and other Species during Filament-Assisted Diamond Growth,* Appl. Phys. Lett.59 (12), September 1991

F. M. Curran, et al., *Medium Power Hydrogen Arcjet Operation,* AIAA 91-2227, 27th Joint Propulsion Conference, June 1991

J. G. Liebeskind, R. K. Hanson and M. A. Cappelli, *Laser-Induced Fluorescence of Atomic Hydrogen in an Arcjet Thruster,* AIAA 92-0678, 30th Aerospace Sciences Meeting & Exhibit, Reno, Jan. 6–9, 1992

M. A. Cappelli, R. K. Hanson, J. G. Liebeskind and D. H. Manzella, *Optical Diagnostics of a Low Power Hydrogen Arcjet,* presented at the AIDAA/AIAA/DGLR/JSASS 22nd Int'l Electric Propulsion Conf., Italy, October 1991

B. Glocker, M. Auweter-Kurtz, T. M. Goelz, H. L. Kurtz, H. L. Schrade, *Medium Power Arcjet Thruster Experiments,* AIAA 90-2531, 21st Int'l Electric Propulsion Conf., Jul. 18–20, 1990

M. H. Loh and M. A. Cappelli, *Diamond Synthesis in a Supersonic DC-Arcjet Plasma at Subtorr Pressures,* presented at the Int'l Conf. on Metallurgica Coatings and Thin Films, San Diego, Apr. 6–10, 1992

D. S. Knight and W. B. White, *Characterization of Diamond Films by Raman Spectroscopy,* J.Mat. Res. 4(2), 385, 1989

R. J. Nemanich, J. T. Glass, G. Lucovsky and R. E. Shroder, *Raman Scattering Characterization of Carbon Bonding in Diamond and Diamondlike Thin Films,* J.Vac. Sci. Technol. A6(3), May/June 1988

K. A. Snail, J. A. Freitas, C. L. Vold and L. M. Hanssen, Proc. of the 2d Int'l Symposium on Diamond Materials, Washington, D.C. May 6–10, 1991

M. A. Cappelli, T. G. Owano and C. H. Kruger, *High Growth Rate Diamond Synthesis in a Large Area Atmospheric Pressure Inductively Coupled Plasma,* J.Mater. Res., 5(11), Nov. 1990

What is claimed is:

1. The method of forming diamond films using an arcjet assembly comprising a vacuum chamber, an anode having a throat and an expansion region extending into said vacuum chamber, a cathode spaced from the throat of said anode and a substrate in said vacuum chamber spaced from the expansion region of the anode which comprises the steps of maintaining pressure in said vacuum chamber below 1 torr applying a high DC voltage between the cathode and anode to create a direct current, low pressure arc, introducing a mixture of an inert gas and hydrogen into the cathode end of said arcjet assembly whereby the mixture flows through the throat as a result of pressure differential between the cathode end and the vacuum chamber and the arc heats the mixture to temperatures on the order of 20,000° K. to dissociate the hydrogen to form atomic hydrogen as well as ionize the inert gas to produce a high velocity plasma plume as a result pressure differential and arc heating, said high velocity plasma plume and low pressures in the nozzle, causing the arc to diffusely attach to the expansion region of the anode, introducing a hydrocarbon into the arc plasma plume to form hydrocarbon precursors, and causing the hydrocarbon precursors and atomic hydrogen to impinge upon the surface of the substrate where they react to form a diamond film.

2. The method as in claim 1 in which the inert gas is argon and the hydrogen argon mixtures are in the volume ratio between 30/70 and 100/0.

3. The method as in claim 1 or 2 in which the hydrocarbon is methane or acetylene.

4. The method as in claim 1 or 2 in which the hydrocarbon/hydrogen ratio is between 0.5 and 25%.

5. The method as in claim 1 in which the substrate is silicon.

6. The method as in claim 1 in which the substrate is molybdenum.

7. The method as in claim 1 in which the substrate is cooled.

8. The method as in claim 1 or 2 in which the arc plasma is formed at high pressure and expands to low-pressure.

9. The method as in claim 8 in which the low pressure is between 0.1 and 1 torr.

* * * * *

UNITED STATES PATENT AND TRADEMARK OFFICE
CERTIFICATE OF CORRECTION

PATENT NO. : 5,358,596

DATED : October 25, 1994

INVENTOR(S) : Mark A. Cappelli, et al.

It is certified that error appears in the above-identified patent and that said Letters Patent is hereby corrected as shown below:

Column 1, line 3, below the title: --This invention was made with Government support under Contract No. N00014-89-J-1197 awarded by the Navy. The Government has certain rights in this invention.--

Signed and Sealed this

Twenty-first Day of February, 1995

Attest:

BRUCE LEHMAN

*Attesting Officer*       *Commissioner of Patents and Trademarks*